June 14, 1966 C. R. HURTIG 3,256,498
CRYSTAL CONTROLLED OSCILLATOR WITH FREQUENCY MODULATING CIRCUIT
Filed Oct. 7, 1963
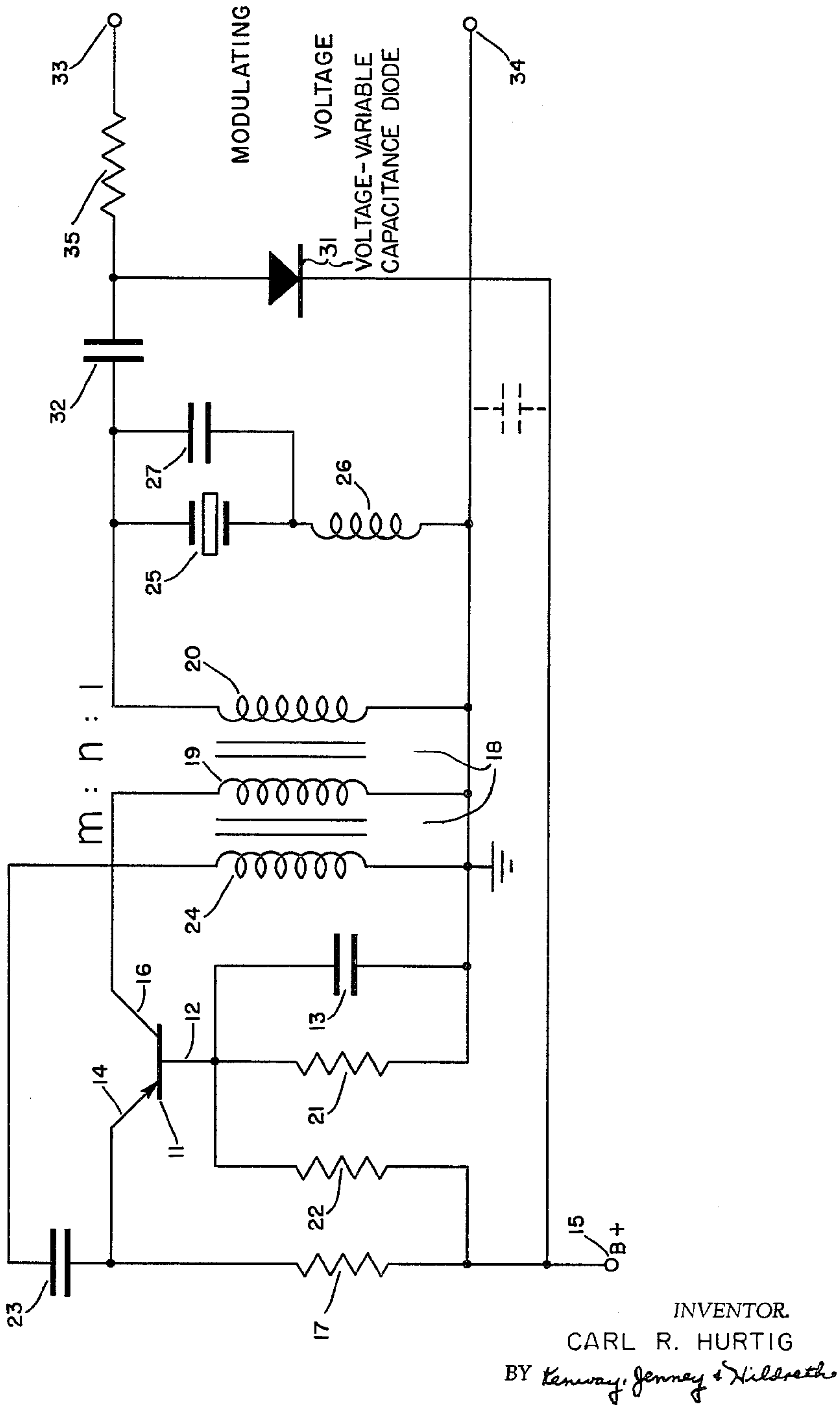
INVENTOR.
CARL R. HURTIG
BY Kenway, Jenney & Hildreth
ATTORNEYS United States Patent Office 3,256,498

Patented June 14, 1966

3,256,498
CRYSTAL CONTROLLED OSCILLATOR WITH FREQUENCY MODULATING CIRCUIT

Carl R. Hurtig, Greenbush, Mass., assignor to Damon Engineering Inc., Needham Heights, Mass., a corporation of Delaware Filed Oct. 7, 1963, Ser. No. 314,160
4 Claims. (Cl. 332—26)

This invention relates generally to crystal controlled oscillators and in particular it concerns a crystal controlled transistor oscillator incorporating a variable reactance diode to modulate the oscillator frequency.

It is an object of the invention to modulate the frequency of an oscillator with respect to a predetermined center frequency which is precisely controlled.

It is another object of the invention to make use of a semiconductor diode as a modulating device and to linearize the frequency response of the oscillator to the modulating voltage.

It is still another object to modulate the frequency of the oscillator over a substantial range of frequencies.

It is a further object to accomplish the foregoing objects with a circuit of few elements which is inexpensive to fabricate, can be compactly packaged, and is reliable.

The novel features of the invention together with further objects and advantages will become apparent from the following detailed description and the accompanying drawing to which the description refers. In the drawing the oscillator of the invention is illustrated schematically.

With reference now to the drawing, it will be observed that the numeral 11 designates a transistor which is arranged in a grounded base configuration. That is, base 12 of the transistor is connected to a common point or ground by means of a bypass capacitor 13; the emitter 14 is connected to a source of positive potential by way of a terminal 15; and the collector 16 of the transistor is coupled to a load circuit by means of a transformer 18 having primary and secondary windings 19 and 20. In the emitter circuit there is a current limiting resistor 17, and in the base circuit there is a resistor 21. Resistor 21 is connected through a resistor 22 to terminal 15 for biasing the transistor. A positive feed-back path is provided by a capacitor 23 which is connected between emitter 12 and a tertiary winding 24 on the transformer.

The load circuit of the transistor is formed with a piezoelectric element 25, and an inductance 26 in series across secondary winding 20. Also, there is a capacitor 27 shunting the piezoelectric element or crystal 25. Capacitor 27 may be taken to include the shunt capacitance of the crystal together with the stray capacitance of the crystal holder and leads. In fact, when there is no need to adjust the crystal antiresonant frequency, capacitor 27 may be dispensed with as a separate circuit element. Inductance 26, on the other hand, serves to neutralize a substantial portion of the shunt capacitance of the crystal and hence, according to the invention must be embodied in a separate circuit element. Rather than a single inductance, however, it may be synthesized from the parallel combination of an inductor and capacitor (not shown), whose resonant frequency is slightly greater than that of the crystal. This, of course, is a practical expedient well known to those skilled in the art.

To modulate the oscillator frequency, there is provided a variable capacitance diode 31, which is effectively disposed in parallel with the load circuit. In particular, the positive side of the diode is connected to the crystal through a coupling capacitor 32 and the negative side of the diode is coupled to the positive terminal 15. A source of modulating voltage is applied to the diode by way of terminals 33 and 34 which are connected to a resistor 35 and to ground, respectively. Resistor 35 in turn is connected to the positive side of the diode. Since the internal impedance of the source of positive potential is usually relatively low, the positive terminal 15 may be regarded as the equivalent of ground for A.C. signals. If this is not the case, however, a bypass capacitor can be added such as that shown in dotted outline in the drawing.

In operation, the center frequency of the oscillator, that is the frequency when there is no modulating voltage present, is established primarily by the antiresonant frequency of the crystal. At this frequency, the impedance of the crystal is matched to the load circuit of the transistor by transformer 18, and in particular the turns ratio between windings 19 and 20. This permits the use of a conventional crystal with a relatively high impedance (at antiresonance) and a high quality factor Q for more precise control of the center frequency of the oscillator instead of a lower impedance crystal which has a lower Q and often times exhibits spurious modes of resonance.

When a modulating signal or voltage is applied to terminals 33, 34, corresponding variations in the capacitance of diode 31 are produced by virtue of its special voltage vs. reactance characteristic. Diodes of this type are readily available commercially and in actual practice a type V20 has been found to work well. Since diode 31 is effectively disposed in parallel relation to the crystal load circuit, variations in its capacitance directly affect the resonant frequency of the load circuit and hence cause deviations from the center frequency of oscillation as determined primarily by the crystal and secondarily by the quiescent value of the diode capacitance. Biasing for the diode to place it in its proper quiescent state is obtained from terminal 15, as shown.

Another advantage of the oscillator circuit, according to the invention, obtains from the effect of inductance 26 upon the modulation function. Inductance 26 serves to neutralize the shunt capacitance associated with the crystal and thereby create another resonant frequency or zero spaced below the crystal antiresonant frequency. In other words, the crystal impedance characteristic is made more nearly symmetrical. Although near perfect symmetry could be achieved in this way, according to the invention, the value of inductance 26 is chosen so that this is not the case. Instead, the impedance characteristic of the crystal is adjusted by means of inductance 26 so as to compensate for second order distortion introduced by the diode which is inherently a non-linear device. A very nearly linear relation between the modulating voltage and oscillator frequency is obtained in this way. By way of example, harmonic distortion can be made less than 2% for a modulation range of ±.25% of center frequency.

Although the invention has been described in terms of a single preferred embodiment, variants of the embodiment that are within the spirit and scope of the invention will no doubt occur to those skilled in the art. For example, a different oscillator configuration can be readily substituted for the one illustrated or a more elaborate type of variable reactance modulating circuit can be conveniently employed. Therefore, the invention should not be deemed to be limited to the details of what has been described herein by way of illustration, but rather it should be deemed to be limited only by the scope of the appended claims.

What is claimed is:

1. A variable frequency self-oscillator which comprises:
   a transistor amplifier having an input electrode and an output electrode,
   a piezoelectric crystal element coupled to said output electrode,
   a path coupled to said element for feeding back to said input electrode a signal that varies in related conformance with the magnitude of a voltage developed across said element, whereby said oscillator operates preferentially at the antiresonant frequency of said crystal element, an inductor connected in series with said element and proportioned to establish, with the effective capacitance of said element, a series resonant frequency spaced, on the frequency scale, below said antiresonant frequency, whereby the shoulder of the voltage-frequency characteristic of said crystal and inductor, taken together, in extending from said antiresonant frequency to said series resonant frequency, is more nearly linear than that of said crystal element alone, a voltage-sensitive variable capacitor connected in shunt with the series combination of said crystal element and said inductor, and connections for impressing a modulating voltage on said variable capacitor, thereby to cause deviations of the oscillation frequency from said antiresonant frequency.

2. In combination with apparatus as defined in claim 1:

a trimmer capacitor connected in shunt with said crystal element, thereby to modify the magnitude of the effective capacitance of said crystal element, said capacitor being proportioned to locate the antiresonant frequency of the crystal element and the trimmer capacitor, taken together, precisely at a desired point of the frequency scale.

3. A voltage-controlled self-oscillator which comprises:

a transistor having an input electrode and an output electrode, a transformer having a primary winding connected to said output electrode, a feedback winding connected to said input electrode and a secondary load winding, a frequency-determining network connected to the terminals of said load winding, said frequency-determining network comprising a piezoelectric crystal element and an inductor connected in series with said element whereby the frequency of maximal load voltage and hence of maximal feedback voltage is that at which said crystal operates in its antiresonant mode, and whereby, as said antiresonant frequency is departed from thus to permit the flow of current through said crystal element, the influence of said inductor comes into play to reduce the curvature of the voltage-frequency characteristic of said frequency-determining network, a voltage-sensitive variable capacitor connected effectively in shunt with said network, and connections for impressing a modulating voltage on said variable capacitor, thereby to cause deviations of the frequency of oscillation from said antiresonant frequency.

4. A voltage-controlled self-oscillator which comprises:

a transistor having an input electrode and an output electrode, a transformer having a primary winding connected to said output electrode, a feedback winding connected to said input electrode and a secondary load winding, a frequency-determining network connected to the terminals of said load winding, said frequency-determining network comprising a piezoelectric crystal element, a capacitor shunting said element and an inductor connected in series with said element whereby the frequency of maximal load voltage and hence of maximal feedback voltage is that at which said crystal operates in its antiresonant mode, as slightly modified by the influence of said shunt-connected capacitor and whereby, as said antiresonant frequency is departed from, thus to permit the flow of current through said crystal element, the influence of said inductor comes into play to reduce the curvature of the voltage-frequency characteristic of said frequency-determining network, a voltage-sensitive variable capacitor connected effectively in shunt with said network, and connections for impressing a modulating voltage on said variable capacitor, thereby to cause deviations of the frequency of oscillation from said modified antiresonant frequency.

References Cited by the Examiner

UNITED STATES PATENTS

| | | | |
|---|---|---|---|
| 3,092,787 | 6/1963 | Pohlman et al. | 332—26 X |
| 3,154,753 | 10/1964 | Rusy | 332—26 |

FOREIGN PATENTS

| | | |
|---|---|---|
| 833,740 | 4/1960 | Great Britain. |

ROY LAKE, *Primary Examiner.*

ALFRED BRODY, *Examiner.*